United States Patent
Ra et al.

(10) Patent No.: US 9,887,040 B2
(45) Date of Patent: Feb. 6, 2018

(54) MULTILAYER ELECTRONIC COMPONENT AND BOARD HAVING THE SAME

(71) Applicant: SAMSUNG ELECTRO-MECHANICS CO., LTD., Suwon-si, Gyeonggi-do (KR)

(72) Inventors: Seung Hyun Ra, Suwon-si (KR); Yong Gyu Han, Suwon-si (KR)

(73) Assignee: SAMSUNG ELECTRO-MECHANICS, CO. LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/222,636

(22) Filed: Jul. 28, 2016

(65) Prior Publication Data

US 2017/0162334 A1 Jun. 8, 2017

(30) Foreign Application Priority Data

Dec. 4, 2015 (KR) .......................... 10-2015-0172511

(51) Int. Cl.

| H01G 4/38 | (2006.01) |
|---|---|
| H01G 4/232 | (2006.01) |
| H05K 1/11 | (2006.01) |
| H05K 1/18 | (2006.01) |
| H05K 1/02 | (2006.01) |
| H01G 4/005 | (2006.01) |

(Continued)

(52) U.S. Cl.
CPC ............. *H01G 4/385* (2013.01); *H01G 4/005* (2013.01); *H01G 4/232* (2013.01); *H01G 4/30* (2013.01); *H05K 1/0231* (2013.01); *H05K 1/0243* (2013.01); *H05K 1/111* (2013.01); *H05K 1/181* (2013.01); *H05K 3/341* (2013.01); *H05K 2201/10015* (2013.01)

(58) Field of Classification Search
CPC ........ H01G 4/385; H01G 4/005; H01G 4/232; H01G 4/30; H05K 1/0231; H05K 1/0243; H05K 1/111; H05K 1/181
USPC .......................................................... 174/260
See application file for complete search history.

(56) References Cited

U.S. PATENT DOCUMENTS

| 3,612,963 A * | 10/1971 | Piper ..................... H01G 4/2325 29/25.42 |
|---|---|---|
| 2010/0188798 A1* | 7/2010 | Togashi ................... H01G 2/06 361/306.3 |
| 2016/0183384 A1* | 6/2016 | Trinh ....................... H01G 2/06 228/123.1 |

FOREIGN PATENT DOCUMENTS

| JP | 11-040460 | * 2/1999 |
|---|---|---|
| JP | 11-40460 A | 2/1999 |
| JP | 2000-306769 A | 11/2000 |

* cited by examiner

*Primary Examiner* — Timothy Thompson
*Assistant Examiner* — Charles Pizzuto
(74) *Attorney, Agent, or Firm* — McDermott Will & Emery LLP

(57) ABSTRACT

A multilayer electronic component includes a first capacitor including a first capacitor body and first and second external electrodes disposed on outer surfaces of the first capacitor body; and a second capacitor including a second capacitor body and third and fourth external electrodes disposed on outer surfaces of the second capacitor body and electrically connected to the first capacitor. The first and third external electrodes are connected to each other by a first metal terminal enclosing portions of a lower surface of the first external electrode to an upper surface of the third external electrode, and the second and fourth external electrodes are connected to each other by a second metal terminal enclos- (Continued)

ing portions of a lower surface of the second external electrode and an upper surface of the fourth external electrode.

15 Claims, 7 Drawing Sheets

(51) Int. Cl.
*H01G 4/30* (2006.01)
*H05K 3/34* (2006.01)

MULTILAYER ELECTRONIC COMPONENT AND BOARD HAVING THE SAME

CROSS-REFERENCE TO RELATED APPLICATION

This application claims the benefit of priority to Korean Patent Application No. 10-2015-0172511, filed on Dec. 4, 2015 with the Korean Intellectual Property Office, the entirety of which is incorporated herein by reference.

BACKGROUND

The present disclosure relates to a multilayer electronic component and a board having the same.

Electronic components using ceramic material, such as capacitors, inductors, piezoelectric elements, varistors, thermistors, and the like, include a ceramic body formed of ceramic material, internal electrodes formed in the ceramic body, and external electrodes installed on surfaces of the ceramic body so as to be connected to the internal electrodes.

Among ceramic electronic components, a multilayer ceramic capacitor includes a plurality of dielectric layers that are stacked, internal electrodes disposed to face each other with at least one of the dielectric layers interposed therebetween, and external electrodes electrically connected to the internal electrodes.

A multilayer ceramic capacitor has various advantages including a compact size, high capacitance, and an easy mountability.

In a case of a multilayer electronic component in which two or more multilayer ceramic capacitors are stacked, the process of stacking the multilayer ceramic capacitors and coupling the multilayer ceramic capacitors to each other may generate a volume increase unrelated to capacitance.

In addition, in the case of a multilayer electronic component including the multilayer ceramic capacitors, an equivalent series inductance (ESL) value may be problematic. Therefore, an electronic component having low ESL depending on use has been demanded.

A multilayer ceramic capacitor has been usefully implemented as a bypass capacitor disposed in a power supply circuit of a large scale integrated circuit (LSI). In order for the multilayer ceramic capacitor to serve as the bypass capacitor, the multilayer ceramic capacitor should effectively remove high frequency noise. This demand has further increased in accordance with a trend toward an increase in a frequency of an electronic apparatus. The multilayer ceramic capacitor used as the bypass capacitor may be electrically connected onto mounting pads on a circuit board through soldering, and the mounting pads may be connected to other external circuits through a wiring pattern on the circuit board or conductive vias.

SUMMARY

An aspect of the present disclosure provides a multilayer electronic component of which equivalent series inductance (ESL) is reduced, and a board having the same.

According to an aspect of the present disclosure, a multilayer electronic component includes: a first capacitor including a first capacitor body and first and second external electrodes disposed on outer surfaces of the first capacitor body; a second capacitor including a second capacitor body and third and fourth external electrodes disposed on outer surfaces of the second capacitor body and electrically connected to the first capacitor; a first metal terminal enclosing a portion of a lower surface of the first external electrode and an upper surface of the third external electrode to connect the first and second capacitors to each other; and a second metal terminal enclosing a portion of a lower surface of the second external electrode and an upper surface of the fourth external electrode to connect the first and second capacitors to each other.

According to another aspect of the present disclosure, a board may have the multilayer electronic component mounted thereon.

BRIEF DESCRIPTION OF THE DRAWINGS

The above and other aspects, features, and advantages of the present disclosure will be more clearly understood from the following detailed description taken in conjunction with the accompanying drawings, in which.

DETAILED DESCRIPTION

Figure 1:
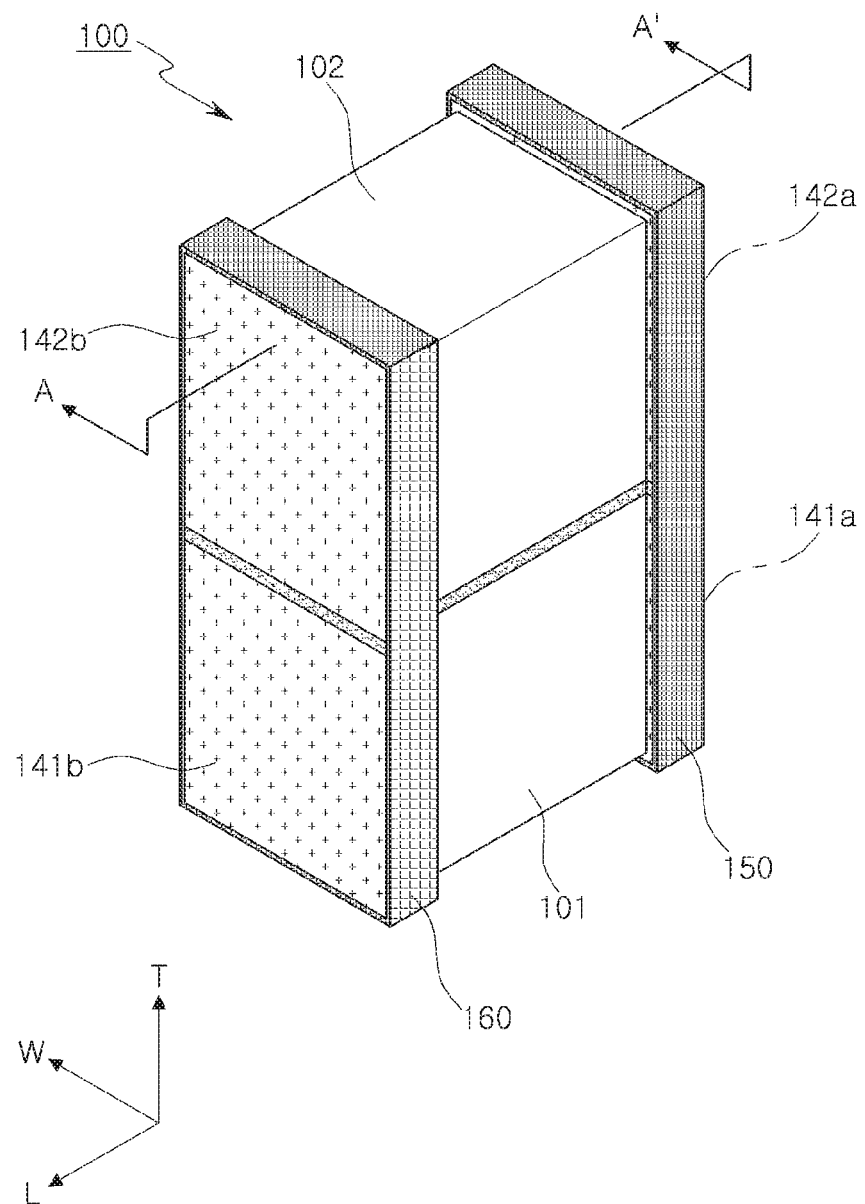
FIG. 1 is a perspective view schematically illustrating a multilayer electronic component according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Multilayer Electronic Component

A multilayer electronic component according to an exemplary embodiment in the present disclosure may include a first capacitor, a second capacitor, a first metal terminal, and a second metal terminal.

The first capacitor may include a first capacitor body and first and second external electrodes disposed on outer surfaces of the first capacitor body, and the second capacitor may be electrically connected to the first capacitor and may include a second capacitor body and third and fourth external electrodes disposed on outer surfaces of the second capacitor body.

Meanwhile, the first metal terminal may enclose regions from the first external electrode disposed on a lower surface of the first capacitor to the third external electrode disposed on an upper surface of the second capacitor to connect the first and third external electrodes to each other, and the second metal terminal may enclose regions from the second external electrode disposed on the lower surface of the first capacitor to the fourth external electrode disposed on the upper surface of the second capacitor to connect the second and fourth external electrodes to each other.

Hereinafter, exemplary embodiments in the present disclosure will be described in detail with reference to the accompanying drawings.

Figure 2:
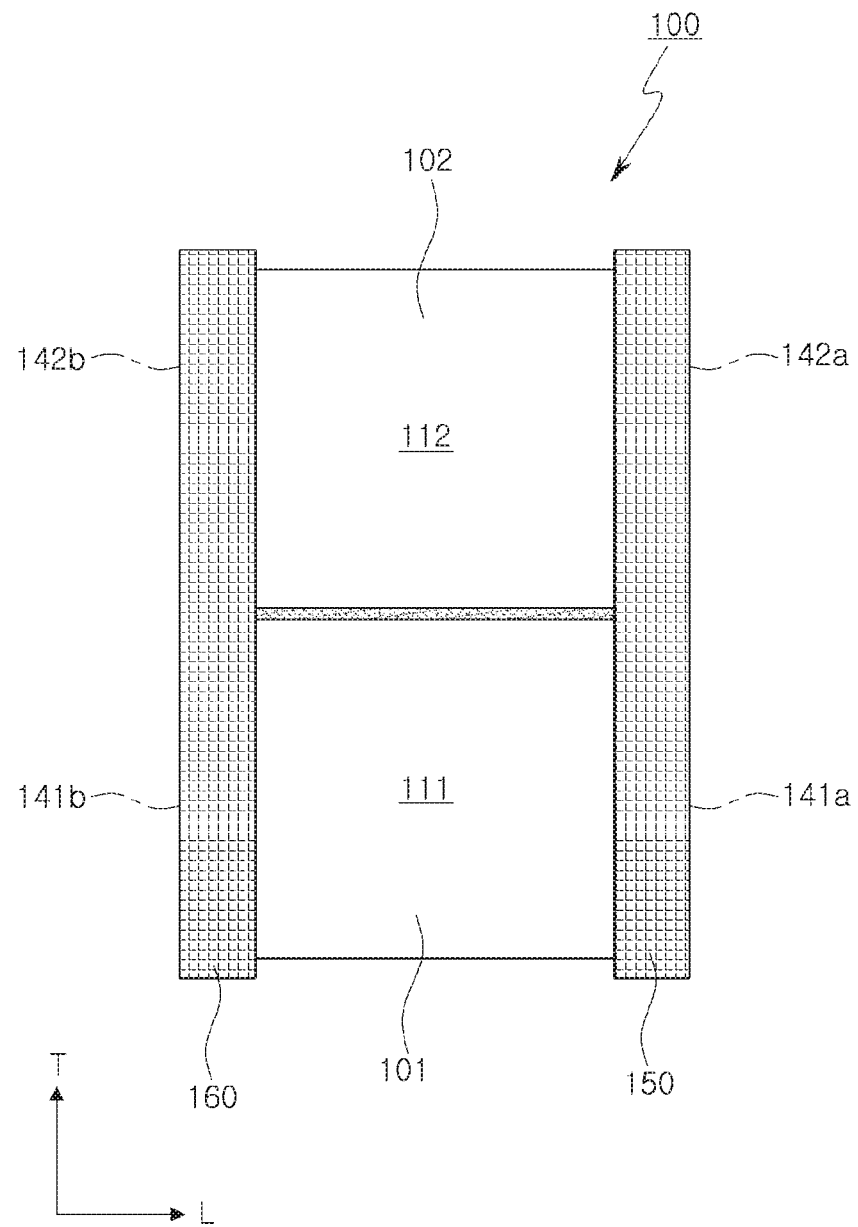
FIG. 2 is a cross-sectional view taken along line A-A' of FIG. 1.

FIG. 1 is a perspective view of a multilayer electronic component 100 according to an exemplary embodiment in the present disclosure; and FIG. 2 is a cross-sectional view taken along line A-A' of FIG. 1.

According to an exemplary embodiment in the present disclosure, a T-direction, which is a thickness direction of capacitor bodies, refers to a stacked direction of the capacitor bodies, an L-direction refers to a length direction of the capacitor bodies, and a W-direction refers to a width direction of the capacitor bodies.

Here, the "thickness direction" refers to a direction in which capacitors are stacked, that is, a "stacked direction".

In addition, according to an exemplary embodiment, in a case in which the multilayer electronic component is mounted on a printed circuit board, a lower surface of the multilayer electronic component refers to a surface facing the printed circuit board, and an upper surface thereof refers to a surface extended from the lower surface in the thickness direction in which the capacitors are stacked.

Referring to FIG. 1, the multilayer electronic component 100 according to the present exemplary embodiment may include a first capacitor 101 and a second capacitor 102, and may include first and second metal terminals 150 and 160 connecting the first and second capacitors 101 and 102 to each other.

The first capacitor 101 may include a first capacitor body 111 and first and second external electrodes 141a and 141b.

The first external electrode 141a may be formed on upper and lower surfaces of the first capacitor body 111, both side surfaces of the first capacitor body 111 in the width direction, and one end surface of the first capacitor body 111 in the length direction.

The second external electrode 141b may be formed on the upper and lower surfaces of the first capacitor body 111, both side surfaces of the first capacitor body 111 in the width direction, and the other end surface of the first capacitor body 111 in the length direction.

The second capacitor 102 may include a second capacitor body 112 and third and fourth external electrodes 142a and 142b.

The third external electrode 142a may be formed on upper and lower surfaces of the second capacitor body 112, both side surfaces of the second capacitor body 112 in the width direction, and one end surface of the second capacitor body 112 in the length direction.

The fourth external electrode 142b may be formed on the upper and lower surfaces of the second capacitor body 112, both side surfaces of the second capacitor body 112 in the width direction, and the other end surface of the second capacitor body 112 in the length direction.

Referring to FIG. 2, the first metal terminal 150 may connect the first and second capacitors 101 and 102 to each other, may be prepared separately from the first and second capacitors 101 and 102, and may enclose portions of surfaces of the first external electrode 141a disposed on the lower surface of the first capacitor body 111 and portions of both side surfaces of the first capacitor body 111 in the width direction and the third external electrode 142a disposed on the upper surface of the second capacitor body 112 and portions of both side surfaces of the second capacitor body 112 in the width direction.

The second metal terminal 160 may connect the first and second capacitors 101 and 102 to each other, may be prepared separately from the first and second capacitors 101 and 102, and may enclose portions of surfaces of the second external electrode 141b disposed on the lower surface of the first capacitor body 111 and portions of both side surfaces of the first capacitor body 111 in the width direction and the fourth external electrode 142b disposed on the upper surface of the second capacitor body 112 and portions of both side surfaces of the second capacitor body 112 in the width direction.

Referring to FIG. 2, even though widths of the first and second metal terminals 150 and 160 formed in the length direction of the first and second capacitor bodies 111 and 112 are substantially the same as each other, widths of the first and second metal terminals 150 and 160 may be different from each other.

In addition, the widths of the first and second metal terminals 150 and 160 may be set to be substantially the same as or larger than those of the first to fourth external electrodes 141a, 141b, 142a, and 142b in the length direction of the first and second capacitor bodies.

In more detail, the width of the first metal terminal 150 may be 80 to 120% of the width of the first external electrode 141a of the first capacitor 101 or may be 80 to 120% of the width of the third external electrode 142a of the second capacitor 102. Likewise, the width of the second metal terminal 160 may be 80 to 120% of the width of the second external electrode 141b of the first capacitor 101 or may be 80 to 120% of the width of the fourth external electrode 142b of the second capacitor 102.

In a case in which the widths of the first and second metal terminals 150 and 160 are less than 80% of the widths of the external electrodes 141a, 141b, 142a and 142b of the first and second capacitors 101 and 102, contact areas between lower surfaces of the first and second metal terminals 150 and 160 and an upper surface of a printed circuit board when the first and second capacitors 101 and 102 are mounted on the printed circuit board may not be sufficient, and thus stable attachment of the first and second capacitors 101 and 102 may not be ensured.

In a case in which widths of the first and second metal terminals 150 and 160 exceed 120% of the widths of the external electrodes 141a, 141b, 142a and 142b of the first and second capacitors 101 and 102, a distance between the first and second metal terminals 150 and 160 of the multilayer electronic component may become excessively close to each other, and thus there is a risk that a short circuit between the first and second metal terminals 150 and 160 will be generated due to a metal migration phenomenon, or the like, between the first and second metal terminals 150 and 160.

Shapes of the first and second capacitor bodies 111 and 112 are not particularly limited, and may be hexahedral shapes, as illustrated in FIG. 2.

Although the first and second capacitor bodies 111 and 112 may not have a hexahedral shape having a perfectly straight line due to sintering shrinkage of ceramic powders when the multilayer electronic component is sintered, they may have a substantially hexahedral shape.

The first capacitor body 111 and the second capacitor body 112 may be connected to each other in parallel.

In more detail, the first metal terminal 150 may have a band shape, and may be disposed to sequentially enclose portions of surfaces of the first external electrode 141a disposed on the lower surface of the first capacitor body 111 and portions of one of both side surfaces of the first capacitor body 111 in the width direction, portions of the third external electrode 142a disposed on one of both side surfaces of the second capacitor body 112 in the width direction, portions of the upper surface of the second capacitor body 112, and portions of the other of both side surfaces of the second capacitor body 112 in the width direction, and portions of the first external electrode 141a disposed on the other of both side surfaces of the first capacitor body 111 in the width direction.

In addition, the second metal terminal 160 may have a band shape, and may be disposed to sequentially enclose surfaces of the second external electrode 141b disposed on the lower surface of the first capacitor body 111 and one of both side surfaces of the first capacitor body 111 in the width direction, the fourth external electrode 142b disposed on one of both side surfaces of the second capacitor body 112 in the width direction, the upper surface of the second capacitor body 112, and the other of both side surfaces of the second capacitor body 112 in the width direction, and the second external electrode 141b disposed on the other of both side surfaces of the first capacitor body 111 in the width direction.

The first and second metal terminals 150 and 160 may also have band shapes connecting the first and second capacitors 101 and 102 to each other, and may be formed of metals. However, shapes and materials of the first and second metal terminals 150 and 160 are not limited thereto. That is, the first and second metal terminals 150 and 160 may be formed of any conductive material, for example, metals such as Ag, Au, Pt, Pd, Ni, Cr, Al, Cu, and the like, or alloys containing one or more of these metals.

According to an exemplary embodiment, the multilayer electronic component may include the first and second capacitors 101 and 102 disposed in parallel with each other.

According to an exemplary embodiment, since firm adhesive strength between the first and second capacitors 101 and 102 may be maintained by the first and second metal terminals 150 and 160, an adhesive for coupling the first and second capacitors 101 and 102 to each other does not necessarily need to be used.

Further, according to an exemplary embodiment, shapes of the lower surfaces of the first and second metal terminals 150 and 160 may be variously modified.

A surface area of a lower surface of the multilayer electronic component connected to electrode pads when the multilayer electronic component 100 is mounted on the printed circuit board may be easily changed by variously modifying the shapes of the lower surfaces of the first and second metal terminals 150 and 160. As a result, solder pastes may be appropriately applied.

In addition, in a case in which the multilayer electronic component 100 according to an exemplary embodiment is mounted on the printed circuit board, an amount of solder paste applied to each of a surface of a region of the first external electrode 141a of the first capacitor 101 formed on one surface of the first capacitor body 111 in the length direction and a surface of a region of the second external electrode 141b of the first capacitor 101 formed on the other surface of the first capacitor body 111 in the length direction may be sufficiently reduced, and thus a factor reducing performance of the external electrodes of the multilayer electronic component 100 may be removed.

In addition, in the case in which the multilayer electronic component 100 according to an exemplary embodiment is mounted on the printed circuit board, an interval between the multilayer electronic component 100 and the printed circuit board may be easily adjusted.

The shapes of the lower surfaces of the first and second metal terminals 150 and 160 may be adjusted so that the lower surfaces of the first and second metal terminals 150 and 160 have various thicknesses. As an example, the lower surfaces of the first and second metal terminals 150 and 160 may have various thicknesses while having a flat shape.

In addition, in a case in which a residual band remaining after the first metal terminal 150 having the band shape encloses regions from the upper surface of the third external electrode 142a to a lower surface of the first external electrode 141a is present, a shape of a lower end of the first metal terminal 150 may be variously adjusted by disposing the residual band on the lower end of the first metal terminal 150.

Likewise, in a case in which a residual band remaining after the second metal terminal 160 having the band shape encloses regions from the upper surface of the fourth external electrode 142b to a lower surface of the second external electrode 141b is present, a shape of a lower end of the second metal terminal 160 may be variously adjusted by disposing the residual band on the lower end of the second metal terminal 160.

Since the shapes of the lower surfaces of the first and second metal terminals 150 and 160 may be easily adjusted as described above, the interval between the multilayer electronic component 100 and the printed circuit board may be easily adjusted.

Meanwhile, since dielectric layers of the capacitor body of the multilayer electronic component 100 have piezoelectric and electrostrictive characteristics, when a direct current (DC) or alternating current (AC) voltage is applied to the multilayer electronic component 100, a piezoelectric phenomenon may be generated between the internal electrodes, and thus vibrations may appear in the capacitor body of the multilayer electronic component 100.

These vibrations may be transferred to the printed circuit board on which the multilayer electronic component 100 is mounted through solders connected to the multilayer electronic component 100, and thus the entire printed circuit board becomes a sound reflecting surface to generate a vibration sound.

The vibration sound may correspond to an audio frequency range of 20 to 20,000 Hz, causing user discomfort. The vibration sound causing user discomfort as described above may be referred to as acoustic noise.

According to an exemplary embodiment, since the interval between the multilayer electronic component 100 and the printed circuit board may be easily adjusted, the acoustic noise may be easily reduced.

Detailed structures of the first and second capacitors 101 and 102 of the multilayer electronic component 100 according to an exemplary embodiment will be described with reference to FIGS. 3A and 3B.

Figure 3A:
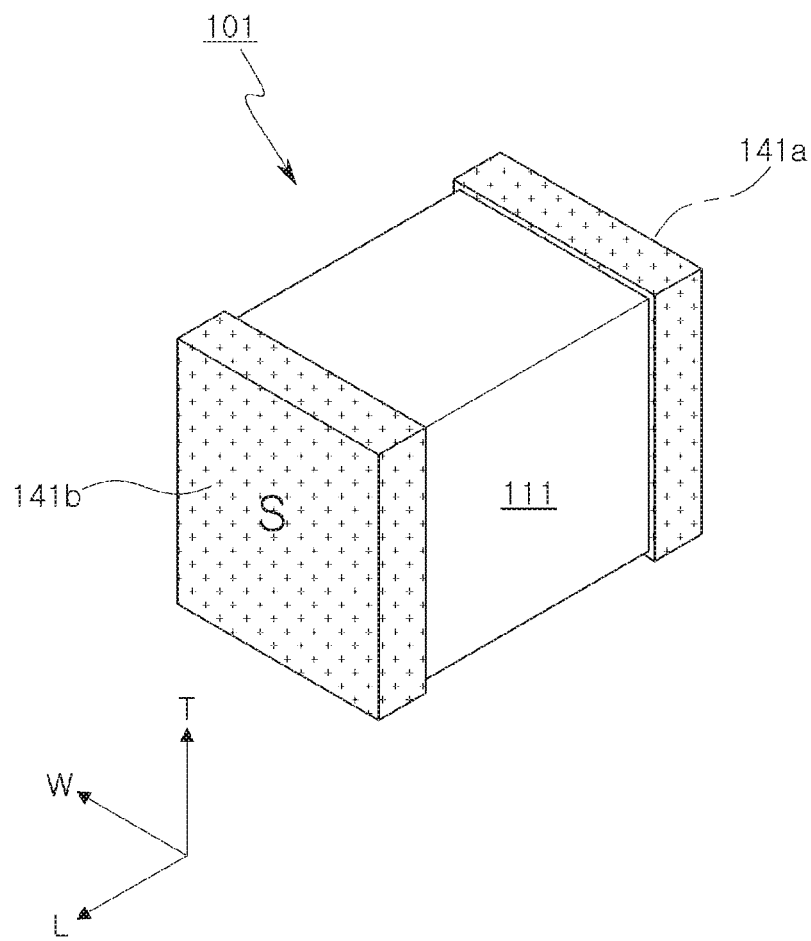
FIG. 3A is a perspective view schematically illustrating a first capacitor of the multilayer electronic component according to an exemplary embodiment.

FIG. 3A is a perspective view schematically illustrating a first capacitor 101 of the multilayer electronic component according to an exemplary embodiment in the present disclosure.

Referring to FIG. 3A, the first capacitor 101 may include the first capacitor body 111 and the first and second external electrodes 141a and 141b disposed on outer surfaces of the first capacitor body 111.

The first external electrode 141a may be formed on both side surfaces of the first capacitor body 111 in the thickness direction (that is, the upper and lower surfaces of the first capacitor body 111), both side surfaces of the first capacitor body 111 in the width direction, and one end surface of the first capacitor body 111 in the length direction.

The second external electrode 141b may be formed on both side surfaces of the first capacitor body 111 in the thickness direction (that is, the upper and lower surfaces of the first capacitor body 111), both side surfaces of the first capacitor body 111 in the width direction, and the other end surface of the first capacitor body 111 in the length direction.

Figure 3B:
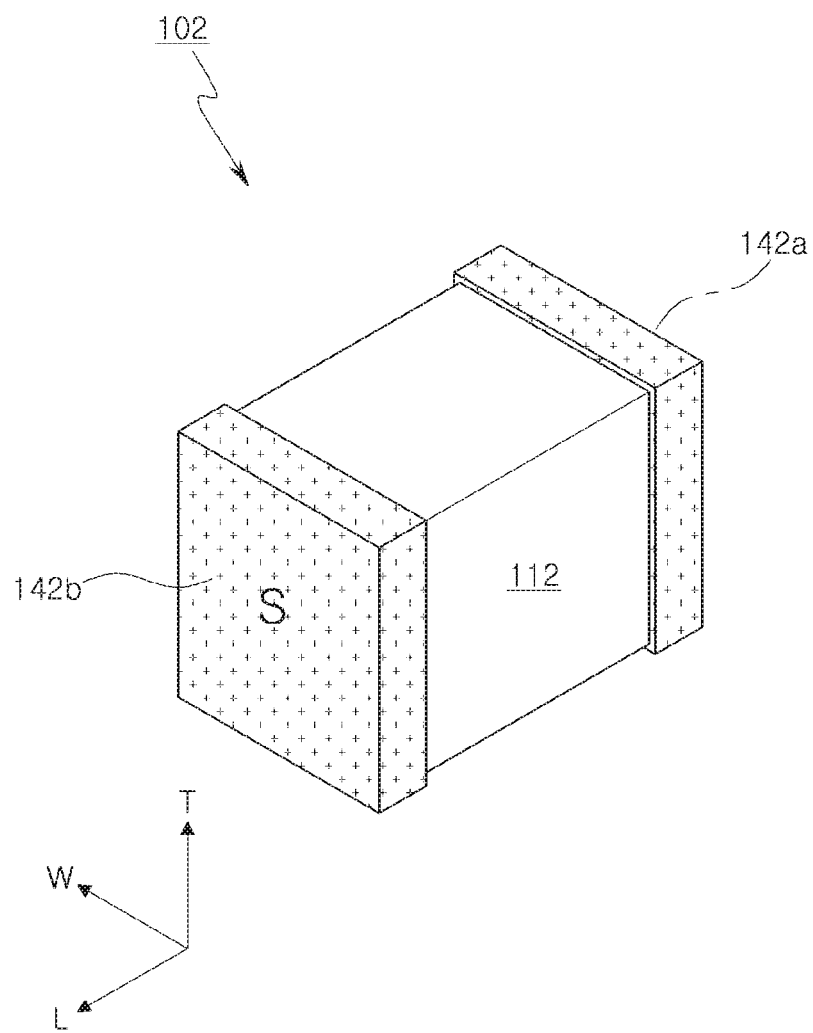
FIG. 3B is a perspective view schematically illustrating a second capacitor of the multilayer electronic component according to an exemplary embodiment.

FIG. 3B is a perspective view schematically illustrating a second capacitor 102 of the multilayer electronic component 100 according to an exemplary embodiment in the present disclosure.

Referring to FIG. 3B, the second capacitor 102 may include the third and fourth external electrodes 142a and 142b disposed on outer surfaces of the second capacitor body 112.

The third external electrode 142a may be formed on both side surfaces of the second capacitor body 112 in the thickness direction (that is, the upper and lower surfaces of the second capacitor body 112), both side surfaces of the second capacitor body 112 in the width direction, and one end surface of the second capacitor body 112 in the length direction.

The fourth external electrode 142b may be formed on both side surfaces of the second capacitor body 112 in the thickness direction (that is, the upper and lower surfaces of the second capacitor body 112), both side surfaces of the second capacitor body 112 in the width direction, and the other end surface of the second capacitor body 112 in the length direction.

Figure 4:
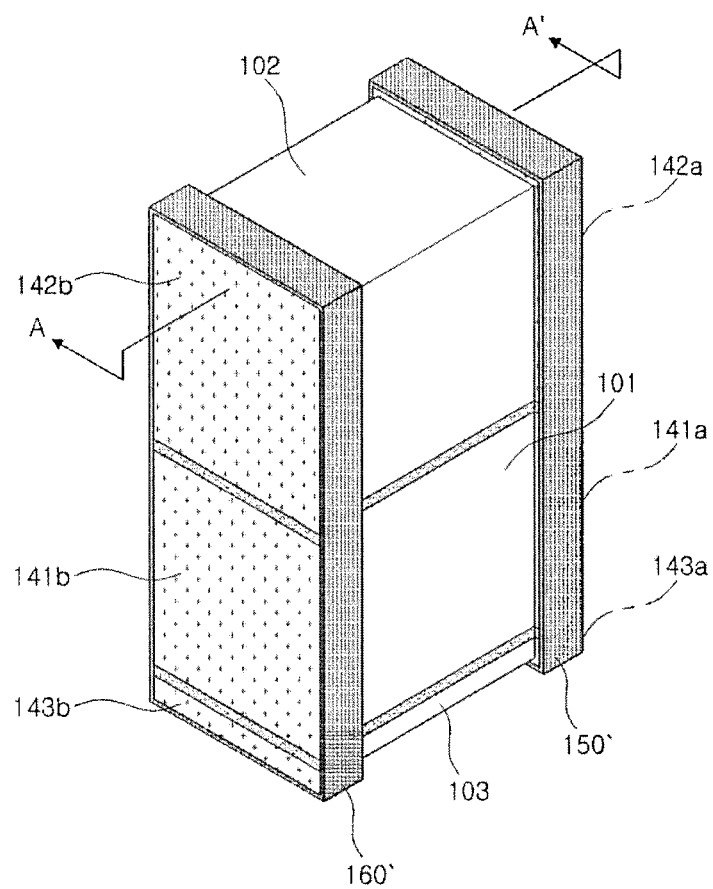
FIG. 4 is a perspective view schematically illustrating a multilayer electronic component according to a modified example of an exemplary embodiment.

A modified example of an exemplary embodiment in the present disclosure may be seen with reference to FIG. 4.

FIG. 4 illustrates a multilayer electronic component further including a dummy substrate 103 disposed on a lower surface of the first capacitor 101 as compared to the multilayer electronic component of FIG. 1.

The dummy substrate 103 may include first and second dummy electrodes 143a and 143b disposed on both side surfaces of a dummy body.

Referring to FIG. 4, the first and second capacitors 101 and 102 and the dummy substrate 103 may be connected to each other by first and second metal terminals 150' and 160'.

The first metal terminal 150' may enclose regions from a lower surface of the first dummy electrode 143a of the dummy substrate 103 to the upper surface of the third external electrode 142a of the second capacitor 102.

The second metal terminal 160' may enclose regions from a lower surface of the second dummy electrode 143b of the dummy substrate 103 to the upper surface of the fourth external electrode 142b of the second capacitor 102.

In more detail, the first metal terminal 150' may enclose surfaces of regions of the lower surface of the first dummy electrode 143a of the dummy substrate 103, the first external electrode 141a disposed on both side surfaces of the first capacitor body 101 in the width direction, the third external electrode 142a disposed on both side surfaces of the second capacitor body 102 in the width direction, and the upper surface of the third external electrode 142a, and the second metal terminal 160' may enclose surfaces of regions of the lower surface of the second dummy electrode 143b of the dummy substrate 103, the second external electrode 141b disposed on both side surfaces of the first capacitor body 101 in the width direction, the fourth external electrode 142b disposed on both side surfaces of the second capacitor body 102 in the width direction, and the upper surface of the fourth external electrode 142b.

The dummy substrate 103 may be an alumina substrate on which electrodes are printed.

In a case in which the alumina substrate on which the electrodes are printed is added to the multilayer electronic component according to an exemplary embodiment, a distance between the multilayer electronic component and the printed circuit board when the multilayer electronic component is mounted on the printed circuit board may be increased, and thus solder cracks may be reduced.

Further, the first and second metal terminals 150 and 160 of the multilayer electronic component according to an exemplary embodiment may have a band shape, and thus they do not need to be extended to surfaces of regions of the first and second external electrodes 141a and 141b disposed on both end surfaces S (see FIGS. 3A and 3B) of the first capacitor body in the length direction.

As a result, the solder pastes do not necessarily need to be applied up to the surfaces of the regions of the first and second external electrodes disposed on both end surfaces of the first capacitor body in the length direction when the multilayer electronic component is mounted on the printed circuit board. Therefore, in the multilayer electronic component according to an exemplary embodiment, a risk that solder cracks will be generated between the solder pastes soldered to the multilayer electronic component after mounting the multilayer electronic component on the printed circuit board may be reduced.

Likewise, according to an exemplary embodiment, also in a case in which the dummy substrate 103 is disposed on the lower surface of the first capacitor 101, the first and second metal terminals 150' and 160' of the multilayer electronic component may have a band shape, and do not need to be extended to surfaces of regions of the first and second external electrodes 141a and 141b disposed on both end surfaces of the first capacitor body in the length direction and surfaces of regions of the first and second dummy electrodes 143a and 143b of the dummy substrate 103 disposed on both end surfaces of the dummy body in the length direction.

Therefore, a cross-sectional area of the multilayer electronic component to which the solder pastes are applied when the multilayer electronic component is mounted on the printed circuit board may be reduced, and thus the occurrence of solder cracks may be reduced.

Board Having Multilayer Electronic Component

Figure 5:
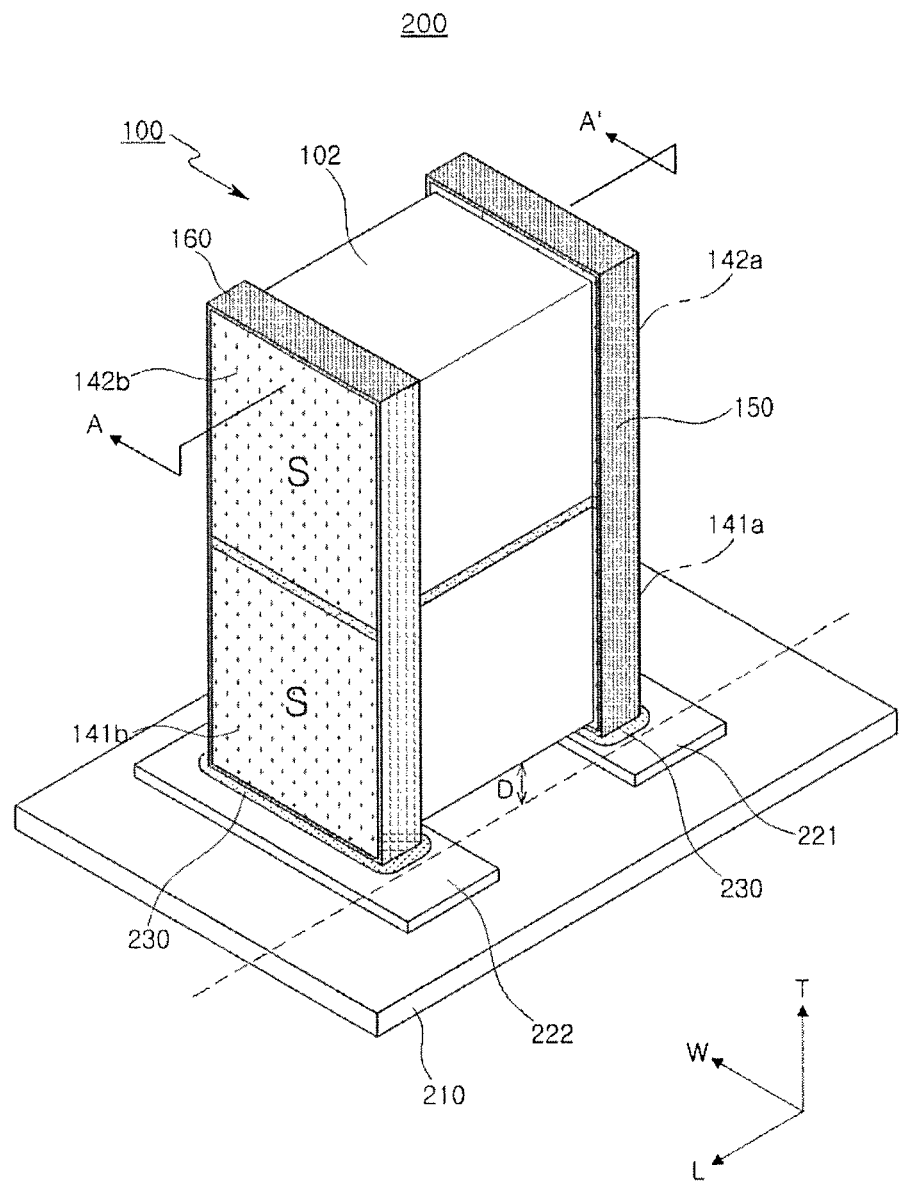
FIG. 5 is a perspective view of a board having a multilayer electronic component according to another exemplary embodiment.
Figure 6:
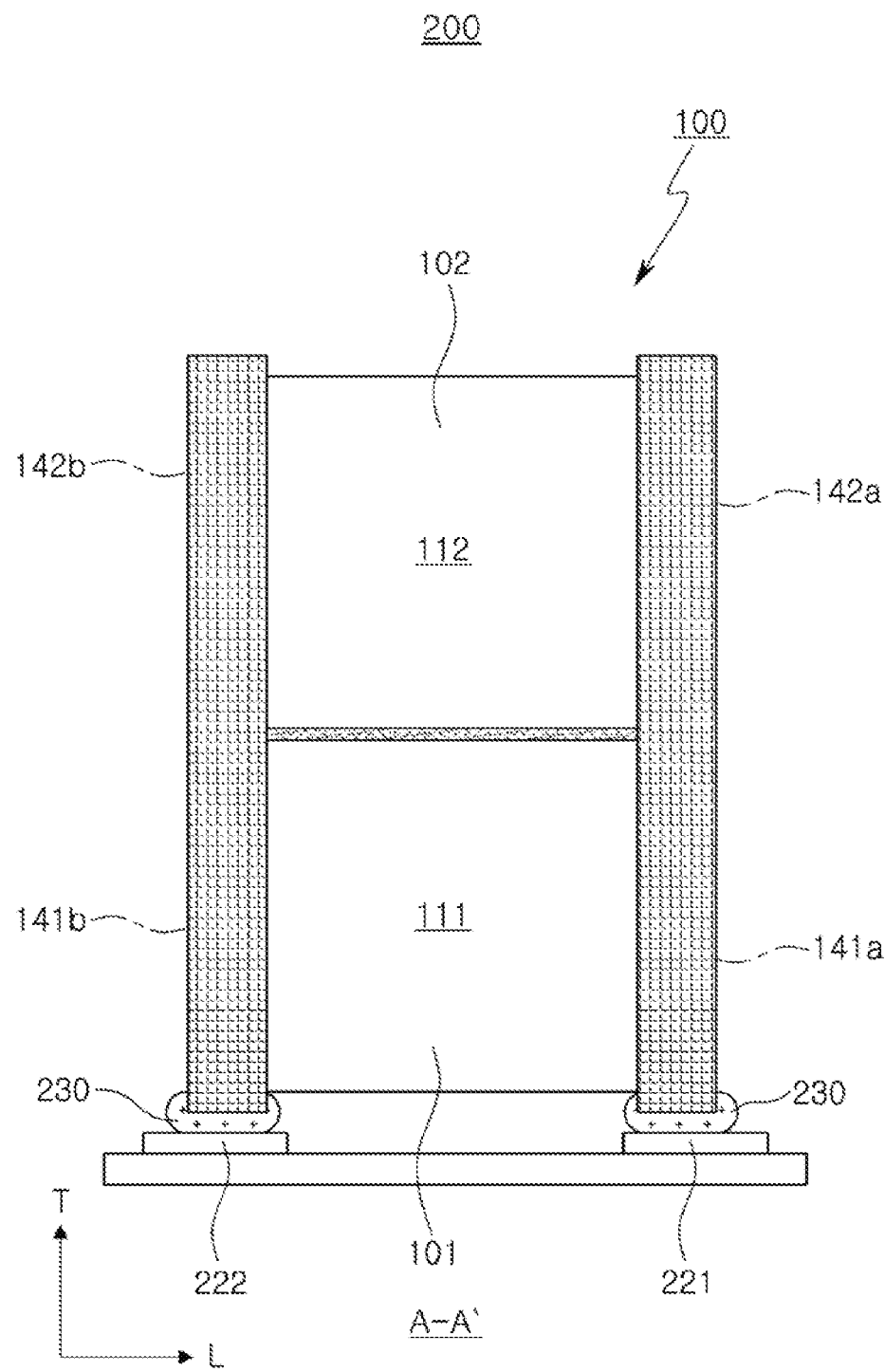
FIG. 6 is a cross-sectional view of the board having a multilayer electronic component, taken along line A-A' of FIG. 5.

FIG. 5 is a perspective view illustrating a form in which the multilayer electronic component 100 according to another exemplary embodiment in the present disclosure is mounted on a printed circuit board; and FIG. 6 is a cross-sectional view taken along line A-A' of FIG. 5.

Referring to FIGS. 5 and 6, a board 200 having a multilayer electronic component according to another exemplary embodiment may include a printed circuit board 210 having electrode pads 221 and 222 disposed thereon, the multilayer electronic component 100 installed on the printed circuit board 210, and solders 230 connecting the electrode pads 221 and 222 and the multilayer electronic component 100 to each other.

The board 200 having a multilayer electronic component according to the present exemplary embodiment may include the printed circuit board 210 on which the multilayer electronic component 100 is mounted and two or more electrode pads 221 and 222 formed on an upper surface of the printed circuit board 210.

The electrode pads 221 and 222 may include first and second electrode pads 221 and 222. The first electrode pad 221 may be connected to the first external electrode 141a disposed on the lower surface of the first capacitor 101 of the multilayer electronic component 100, and the second electrode pad 222 may be connected to the second external electrode 141b disposed on the lower surface of the first capacitor 101 of the multilayer electronic component 100.

Here, in the board having a multilayer electronic component according to an exemplary embodiment, the first and second external electrodes 141a and 141b may contact the first and second electrode pads 221 and 222, respectively, by the solders 230. In the board having a multilayer electronic component according to an exemplary embodiment, the first metal terminal 150 disposed on the lower surface of the first external electrode 141a and the second metal terminal 160 disposed on the lower surface of the second external electrode 141b may substantially contact the first and second electrode pads 221 and 222, respectively, through the solders 230.

Therefore, a shape of the soldered solder paste may be easily adjusted depending on a shape of the lower portion of the first metal terminal 150, and an amount of solder may be selectively reduced.

In addition, a shape set by a region occupied by the solder positioned on the lower surface of the first metal terminal 150 may be substantially the same as a shape of the lower surface of the first metal terminal.

In addition, since the alumina substrate on which the electrodes are printed may be bonded to the lower surface of the first capacitor 101 of the multilayer electronic component according to an exemplary embodiment in the present disclosure, a distance D between the multilayer electronic component 100 and the board having a multilayer electronic component when the multilayer electronic component 100 is mounted on the printed circuit board may be increased, and thus the acoustic noise may be reduced.

In addition, since the first and second metal terminals 150 and 160 are interposed between the printed circuit board 210 and the multilayer electronic component when the multilayer electronic component according to an exemplary embodiment is mounted on the printed circuit board, the acoustic noise generated by the multilayer electronic component may be reduced as compared to a case of directly mounting the multilayer electronic component on the board having a multilayer electronic component.

Here, the acoustic noise generated by the multilayer electronic component may be further reduced by appropriately adjusting the shapes of the lower portions of the first and second metal terminals 150 and 160 and appropriately adjusting the thicknesses of the lower portions of the first and second metal terminals 150 and 160.

As set forth above, according to an exemplary embodiment in the present disclosure, a high capacitance multilayer electronic component of which mounting density is improved, and a board having the same, may be provided.

According to an exemplary embodiment in the present disclosure, a multilayer electronic component having improved equivalent series resistance (ESR) characteristics, and a board having the same, may be provided.

According to an exemplary embodiment in the present disclosure, solder cracks generated in the multilayer electronic component in the case in which the multilayer electronic component is mounted on the printed circuit board may be reduced.

According to an exemplary embodiment in the present disclosure, a multilayer electronic component of which warpage strength is improved, and a board having the same, may be provided.

According to an exemplary embodiment in the present disclosure, a multilayer electronic component of which acoustic noise is significantly reduced, and a board having the same, may be provided.

While exemplary embodiments have been shown and described above, it will be apparent to those skilled in the art that modifications and variations could be made without departing from the scope of the present invention as defined by the appended claims.

What is claimed is:

1. A multilayer electronic component comprising:
a first capacitor including a first capacitor body and first and second external electrodes disposed on outer surfaces of the first capacitor body;
a second capacitor including a second capacitor body and third and fourth external electrodes disposed on outer surfaces of the second capacitor body and electrically connected to the first capacitor;
a first metal terminal enclosing a portion of a lower surface of the first external electrode and a portion of an upper surface of the third external electrode to electrically connect the first and second capacitors to each other; and
a second metal terminal enclosing a portion of a lower surface of the second external electrode and a portion of an upper surface of the fourth external electrode to connect the first and second capacitors to each other,
wherein the first metal terminal has a band shape, and encloses a portion of the lower surface of the first external electrode and a portion of both side surfaces of the first capacitor body in a width direction and a portion of the upper surface of the third external electrode and a portion of both side surfaces of the second capacitor body in the width direction.

2. The multilayer electronic component of claim 1, wherein the second metal terminal has a band shape, and encloses a portion of the lower surface of the second external electrode and a portion of both side surfaces of the first capacitor body in a width direction and a portion of the upper surface of the fourth external electrode and a portion of both side surfaces of the second capacitor body in the width direction.

3. The multilayer electronic component of claim 1, wherein an interval between the first capacitor and a printed circuit board is adjusted by a shape of a lower portion of the first or second metal terminal disposed below the first capacitor.

4. The multilayer electronic component of claim 1, wherein the first and second capacitors are connected to each other in parallel.

5. The multilayer electronic component of claim 1, further comprising a dummy substrate disposed below the first capacitor.

6. The multilayer electronic component of claim 5, wherein the dummy substrate comprises first and second dummy electrodes.

7. The multilayer electronic component of claim 6, wherein the first metal terminal encloses a portion of a lower surface of the first dummy electrode, a portion of both side surfaces of the first capacitor body in the width direction, a portion of both side surfaces of the second capacitor body in the width direction, and a portion of the upper surface of the third external electrode.

8. The multilayer electronic component of claim 6, wherein the second metal terminal encloses a portion of a lower surface of the second dummy electrode, a portion of both side surfaces of the first capacitor body in the width direction, a portion of both side surfaces of the second capacitor body in the width direction, and a portion of the upper surface of the fourth external electrode.

9. The multilayer electronic component of claim 5, wherein the dummy substrate is formed of alumina.

10. The multilayer electronic component of claim 1, wherein a width of the first metal terminal is between 80 and 120% of a width of the first external electrode.

11. The multilayer electronic component of claim 1, wherein a width of the first metal terminal is between 80 and 120% of a width of the third external electrode.

12. The multilayer electronic component of claim 1, wherein a width of the second metal terminal is between 80 and 120% of a width of the second external electrode.

13. The multilayer electronic component of claim 1, wherein a width of the second metal terminal is between 80 and 120% of a width of the fourth external electrode.

14. A board having a multilayer electronic component, comprising:
a printed circuit board having electrode pads disposed thereon;
the multilayer electronic component disposed on the printed circuit board; and
solders connecting the electrode pads and the multilayer electronic component to each other, wherein the multilayer electronic component includes:
a first capacitor including a first capacitor body and first and second external electrodes disposed on outer surfaces of the first capacitor body,
a second capacitor including a second capacitor body and third and fourth external electrodes disposed on outer surfaces of the second capacitor body,
the first and third external electrodes are connected to each other by a first metal terminal enclosing a lower surface of the first external electrode and an upper surface of the third external electrode,
the second and fourth external electrodes are connected to each other by a second metal terminal enclosing a lower surface of the second external electrode and an upper surface of the fourth external electrode, and
the first metal terminal has a band shape, and encloses a portion of the lower surface of the first external electrode and a portion of both side surfaces of the first capacitor body in a width direction and a portion of the upper surface of the third external electrode and a portion of both side surfaces of the second capacitor body in the width direction.

15. The board having a multilayer electronic component of claim 14, wherein the solders are disposed on lower surfaces of the first and second metal terminals to connect the electrode pads and the multilayer electronic component to each other.

* * * * *